United States Patent [19]

Focht

[11] Patent Number: 4,734,663
[45] Date of Patent: Mar. 29, 1988

[54] SEALED FILTER MEMBERS AND PROCESS FOR MAKING SAME

[75] Inventor: Stephen E. Focht, Willow Street, Pa.
[73] Assignee: AMP Incorporated, Harrisburg, Pa.
[21] Appl. No.: 922,604
[22] Filed: Oct. 24, 1986
[51] Int. Cl.$^4$ .......................... H03H 7/01; H03H 3/00
[52] U.S. Cl. ..................................... 333/182; 333/184; 333/185; 439/620; 29/592 R
[58] Field of Search ................ 333/167, 172, 181–185, 333/12; 439/607, 620; 427/79; 29/592 R, 829–832, 841–843, 848, 851, 854–858, 867, 874, 878, 884, 885, 25.41, 25.42; 361/301–303, 305, 311, 321

[56] References Cited

U.S. PATENT DOCUMENTS

Re. 29,258  6/1977  Fritz ..................................... 333/182

OTHER PUBLICATIONS

AMP Catalog, 78–487, + Drawing No. 859623, (p. 30), Revised 9/1934.

Primary Examiner—Marvin L. Nussbaum
Attorney, Agent, or Firm—Katherine A. Nelson

[57] ABSTRACT

A sealed filter member comprises a filter body means having selected first and second surface portions, the first surface portions defining discontinuities between and surrounding the second surface portions; a dielectric polymerizable material polymerized on and adhered to the selected first surface portions defining sealed surface portions and plating material disposed on the second surface portions defining plated surface portions. The plated surface portions comprise electrically discontinuous electrode means. The polymerized dielectric material both excludes plating material from the sealed surface portions during plating and permanently seals the filter body means at the sealed surface portions. The polymerized dielectric material is resistant to solder and solvents and excludes solder and solvents from the sealed surface portions. A process for making the sealed filter members is also disclosed.

15 Claims, 2 Drawing Figures

SEALED FILTER MEMBERS AND PROCESS FOR MAKING SAME

FIELD OF THE INVENTION

This invention relates to filter members for use in electrical connectors and the like, and more particularly to sealed filter members and a method for making the same.

BACKGROUND OF THE INVENTION

Filter members frequently are used on terminals and in electrical connectors to reduce noise and in particular to reduce electromagnetic interference (EMI) an radio frequency interference (RFI). EMI is electromagnetic energy whether it occurs naturally or man made and causes undesirable responses, malfunctions and/or complete failures in electrical equipment. It is often desirable, therefore, to use filters to suppress any external EMI from entering equipment or to absorb or suppress any EMI from being generated by the equipment. RFI is now used interchangeably with the term EMI but generally is limited to interference in the radio communication band.

Filter members are generally comprised of a core material with a layer of plating disposed thereon to form terminal electrodes and ground electrodes. The core member may be comprised of one or more layers to form a sleeve for individual terminals or may be layered in a flat arrangement to form a planar filter member for a multitude of electrical terminals. The core material may be made from a variety of material as is known in the art.

It is important in constructing the filter that the electrical terminal electrodes and the ground electrodes be isolated from each other. Typically this is accomplished by the use of a plating resist, which is applied to the desired surface areas of the core, prior to plating. Plating material is then deposited on the uncoated surfaces to define terminal and ground electrodes, the electrodes being isolated from each other by the plating resist. Generally the plating resist had to be removed prior to soldering the filter members to electrical terminals because conventional plating resists cannot withstand the temperatures and chemicals associated with soldering procedures.

Another way to achieve electrical isolation of the terminal and ground electrodes is to coat the entire core material with the plating material and then selectively remove some of the plated layer by grinding or other such means to chamfer the ends and isolate the terminal electrode from the ground electrode.

One disadvantage in either of the procedures described above, is that one or more additional handling and manufacturing procedures must be performed to the plated filter member before it is ready for electrical engagement with a terminal member.

The exposed surface of the core remaining after either of the aforementioned processes must be protected from the environment during use, particularly from moisture, cleaning solvents, and the like. In many instances the filter members, such as sleeves or planar members are used in an electrical connector which is potted. This potting material covers essentially the whole sleeve, which includes the exposed surfaces of the core thus protecting them from damage owing to moisture, cleaning solvents or the like. In those instances where the electrical connectors are not potted or the filters are being used as loose piece filters or filtered terminals, other means, such as coating the exposed core surfaces with an epoxy or other sealant, have also been used.

It is an object of the present invention to provide a sealed filter member which may be used in potted connectors or as a loose piece filter member.

Furthermore, it is an object of the invention to provide a filter member having a dielectric material disposed on an unplated filter member to define and electrically isolate pin and ground electrode means on the filter surface, said material also providing a plating resist and permanently sealing the body means at those portions.

It is an additional object of the invention to provide means for sealing such filters that is cost effective and usable in automated manufacturing systems.

It is also an object of the invention to provide a means for manufacturing sealed filters that requires a minimum number of manufacturing procedures.

It is an additional object of the invention to provide a means for making sealed filter members that minimizes handling of the filter members.

It is also an object of the invention to provide a plating resist that will also provide protection from solder.

Another object of the invention is to provide a dielectric polymerizable material that can be polymerized on an unplated filter means to form plating resist, solder resist and seal for the surfaces of the filter so coated.

SUMMARY OF THE INVENTION

The invention is directed to a filter member having sealed surface portions and plated surface portions. The filter member comprises a body means having selected first and second surface portions, the first surface portions defining discontinuities between and surrounding the second surface portions. The first surface portions have a dielectric polymerizable material polymerized thereon and adherent thereto to define sealed surface portions. Plating material is disposed on the second surface portions to define plated surface portions which comprise electrically disconnected terminal and ground electrodes. The polymerized dielectric material both excludes plating material from the sealed surface portions during plating and permanently seals the body means at those portions.

The invention is also directed to a method for making the sealed filter member having plated surface portions and sealed surface portions. The method includes the steps of disposing a dielectric polymerizable material on selected first portions of an unplated filter body, the first portion defining discontinuities between and surrounding the second surface body portions onto which plating material is to be disposed. The material is then polymerized by means known in the art. The method used depends upon the polymerization activation system of the dielectric material. In the preferred embodiment the dielectric polymerizable material is UV curable. The polymerized material adheres to the unplated body defining sealed surface portions. Plating material is then disposed on the second surface portions which define electrically disconnected terminal and ground electrodes. The polymerized dielectric material acts as a plating resist and effectively permanently seals the body means at the sealed surface portions. Preferably the polymerized material is also solder resistant.

Some of the objectives and advantages of the invention having been stated, others will appear as the description proceeds when taken in connection with the accompanying drawings.

DESCRIPTION OF THE PREFERRED EMBODIMENT

Figure 1:
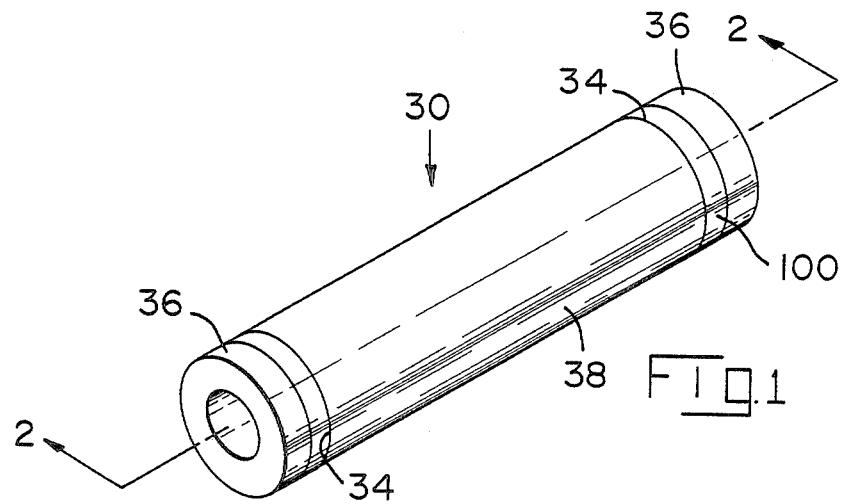
FIG. 1 is a perspective view of a filter sleeve member illustrating the invention disclosed therein.
Figure 2:
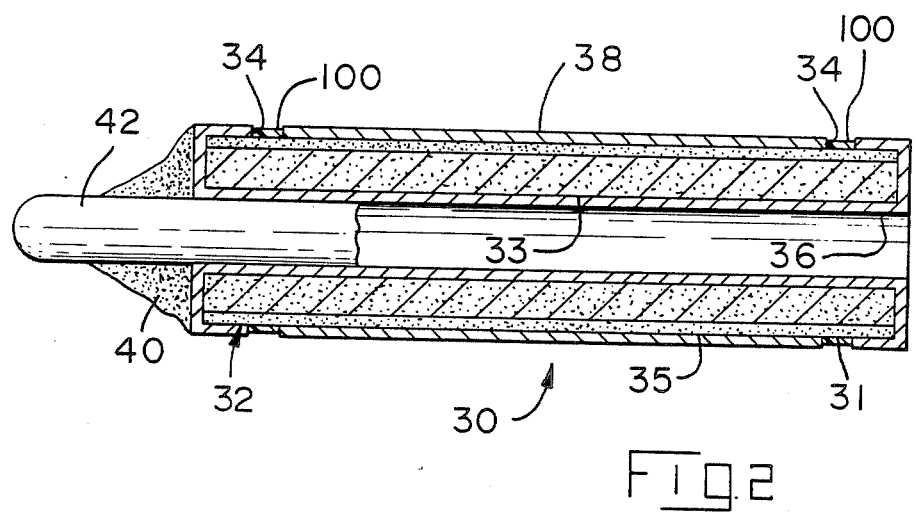
FIG. 2 is a cross-sectional view taken along line 2—2 of FIG. 1 and includes a fragmentary portion of an electrical pin terminal.

FIGS. 1 and 2 illustrate the use of sealant composition 100 and a filter sleeve member 30. Filter sleeve 30 is comprised of an unplated filter body means or core member 32, selected first portions 31 which define discontinuities between and surrounding the second surface portions 33, 35. The dielectric polymerizable material 100 is polymerized on the selected first surface portions 31 of an unplated body means 32. The polymerized material is adherent thereto and defines the sealed surface portions 34. Plating material is disposed on second surface portions 33, 35 to form plated surface portions 36, 38, respectively. Plated surface portions 36, 38 define electrically disconnected terminal and ground electrodes respectively. The polymerized dielectric material both excludes the plating material from the surface portion 34 and permanently seals said body means 32 at the sealed surface portion 34. The polymerized dielectric material further acts as a solder resist when a sleeve is soldered at 40 to a terminal pin 42 as is shown in FIG. 2. The filter body or core member 32 may be made from a variety of materials as is known in the art. For purposes of illustration only, the filter sleeve member shown herein is a distributive element filter of the type disclosed in U.S. Pat. No. Re. 29,258, comprising a ferrite sleeve having a layer of barium titanite disposed thereon. It is to be understood that other materials may also be used for the filter core.

To make a filter member 30 in accordance with the invention, unplated filter body members 32 are first activated and prepared for plating as is known in the art. Dielectric polymerizable material 100 is disposed in bands on selected first surface portions 31 of the unplated core 32, and polymerized thereon.

The sealant is preferably UV curable and is cured by exposing the banded sleeve core 32 to ultraviolet light. In the preferred embodiment the sleeve is exposed to a light of 300 watts per inch for a period of approximately 1 to 2 seconds. Curing is preferably accomplished by placing the sleeve on a conveyor belt and moving the belt beneath the UV light.

The width of the band of sealant needed depends upon the desired characteristic of the finished product. Wider bands are required for filters subjected to higher voltage. If a thick band of sealant is desired, additional layers of material 100 may be applied over the previously polymerized layer and the polymerization process repeated. Once the desired thickness of the bands of sealant has been reached, and the material has been polymerized, the sleeves are plated, using known loose piece plating methods such as a barrel plating line.

Typically the sleeves are plated with a layer of nickel followed by a layer of tin or gold in accordance with methods known in the art. The thickness of the combined plating layers is about 55–85 microinches (0.014–0.022 millimeters). It is to be understood that other metals can also be used for plating the sleeves.

Since the plated material on the sleeve is relatively thin, it is somewhat porous and can absorb moisture, if subjected to a humid environment. It is, therefore, preferable to "waterproof" the plated filter sleeves by vacuum impregnation of a waterproofing material as is known in the art. One such waterproofing material is 2,4,6-tris(allyloxy)-s-triazine and available from American Cyanamide Co., Wayne, NJ, under the trade name Triallyl Cyanurate. Other waterproofing compounds as known in the art may also be used. In addition to sealing the pores of the plated layer, the waterproofing material also waterproofs the junctions of the polymerized sealant material and the plated layers.

The waterproofed filter sleeves are then ready to be mounted to an electrical terminal such as a pin terminal with solder or other methods as known in the art. This is best illustrated by FIG. 2.

The use of sealant material composition 100 in the manner described above offers a number of advantages. The cured sealant is both a plating and solder resist so that when the filters are soldered to the terminals no solder bridges sealed portions 34, thus assuring the electrical isolation between the terminal electrode and ground electrode 36, 38, respectively. In addition, polymerized sealant 100 is chemically resistant, and in particular is resistant to moisture and cleaning solvents thus protecting the filter member from moisture and solvents during its lifetime.

The sealed filter member made in accordance with the invention may be used in both potted and unpotted electrical connectors. The polymerized sealant is chemically inert and does not react with the potting material.

The method for making filter sleeves in accordance with the invention lends itself to automated processes in that the bands of sealant can be applied to selected first surface portions of the core members by machine. The banded core members can then be dropped onto a moving conveyor belt, exposed to ultraviolet light. The banded members are then plated by methods known in the art. The plated filter members are washed to remove excess plating solution after which the pores of the plated portions are sealed with a waterproofing material as previously described.

Prior methods for making filter sleeves of this type involved a number of other steps. In one method, once the plating is completed the edges of the sleeve were beveled to remove the plating in the desired areas. These areas were filled with epoxy or other sealant material which had to be cured. Alternatively, if a plating resist had been used to form the discontinuities between the electrodes, plating resist had to be removed and then an epoxy type sealant material applied to the bare core material. These additional steps usually had to be done manually to ensure the spaces were properly formed and properly sealed. By preparing the filter sleeves in accordance with the invention several steps can be eliminated and the process can be more cost effective because it can be automated.

In formulating the sealant composition 100 for use with the filter members it is important to control the viscosity of the mixture so that the material will not be absorbed into the core material, but will adhere securely to it. In addition, it must not be so viscous that it will not flow to form the proper size bands.

Examples 1 and 2 below give preferred formulations for the dielectric sealant material. Other materials may also be used such as those disclosed in U.S. Pat. Ser. No. 912,026 "Broad Spectrum Light and Heat Curable Sealant Composition and Method of Using Same", filed Sept. 26, 1986.

The following examples illustrate the invention and the ingredients are expressed in parts by weight except where specifically indicated otherwise.

EXAMPLE 1

| No. | Ingredient | Parts by Weight |
|---|---|---|
| 1. | Acrylic ester oligomer[a] | 77 |
| 2. | Acrylic diluent monomer[b] | 13 |
| 3. | 2,2,-dimethoxy-2-phenylacetophenone[c] | 3 |
| 4. | Benzophenone | 1.7 |
| 5. | Triethanolamine | 1.7 |
| 6. | p-Methoxyphenol | 2.4 |
| 7. | Wetting agent[d] | 0.2 |
| 8. | Fumed silica[e] | 1 |

[a]Diamond Shamrock 3016
[b]Diamond Shamrock 4061
[c]Irgacure 651
[d]Modaflow, Monsanto Company
[e]Cab-O-Sil M-5, Cabot Corp.

Ingredient 1 was warmed to 50 C. while ingredients 2, 3, 4, 5, 6 and 7 were stirred together in a black, opaque, one quart polyethylene beaker. Ingredient 1 was added to the mixture and stirred until mixed homogeneously. Ingredient 8 was similarly mixed in, and the final mixture was degassed 45 minutes at 1 mm mercury pressure.

The viscosity was measured at approximately 83,500 centipoises, and the fineness of grind was better than 8.

EXAMPLE 2

The ingredients of Example 1 were used to prepare and compare the effect of modifications of ingredient concentrations on application viscosity and sealing effectiveness. The same procedure of Example 1 was used with the exception that the ingredients were stirred together in a one quart stainless steel beaker and the mixture was degassed for approximately 5 minutes at 1 mm mercury pressure.

| | Formulations in Parts by Weight | | | | | |
|---|---|---|---|---|---|---|
| | Parts by Weight | | | | | |
| Ingredient | A | B | C | D | E | F |
| 1 | 55.0 | 60.0 | 65.0 | 70.0 | 80.0 | 85.0 |
| 2 | 34.5 | 30.0 | 25.0 | 20.0 | 10.0 | 6.0 |
| 3 | 3.0 | 3.0 | 3.0 | 3.0 | 3.0 | 3.0 |
| 4. | 1.7 | 1.7 | 1.7 | 1.7 | 1.7 | 1.7 |
| 5 | 1.7 | 1.7 | 1.7 | 1.7 | 1.7 | 1.7 |
| 6 | 2.4 | 2.4 | 2.4 | 2.4 | 2.4 | 2.4 |
| 7 | 0.2 | 0.2 | 0.2 | 0.2 | 0.2 | 0.2 |
| 8. | 1.5 | 1.0 | 1.0 | 1.0 | 1.0 | 0.0 |

Each of the formulations of Examples 1 and 2 was applied as thick bands on filter sleeve members. The bands were cured by placing the sleeves on a belt and moving the sleeves under a 300 watts per inch ultraviolet light at a speed of 40'/min.

Sleeve samples having each formulation thereon, were subjected to the heat testing. The sleeves were spaced apart on a wire fixture and placed in a preheated closed box kiln for 30 seconds. The sleeves did not touch each other, the frame of the fixture, or sides of the kiln. The temperature selected for preheating the kiln was increased in increments of 50° F. (10° C.) from 650° F. (343° C.) to 1100° F. (593° C.). Fresh sleeve samples with each formulation were used for each temperature.

The bands on the sleeves were examined before and after the tests at a magnification of 70. No change in appearance was observed until 1050° F. (566° C.) when all samples darkened slightly. The samples tested at 1100° F. (593° C.) were even darker. A slight odor was detected at 950° F. (510° C.). The odor intensified with increasing temperature.

Sleeve samples having all formulations were tested and shown to be resistant to standard cleaning chemicals, flux removers and degreasers. The bands softened slightly on prolonged exposure (greater than one minute) to methylene chloride.

Dielectric withstanding voltage (DWV) testing was performed on sample filter sleeves made in accordance with the invention. Each sleeve was placed on a test pin contact that was attached to a negative electrode. A positive electrode was attached to the ground electrode of the sleeve. A voltage was applied. The voltage was increased slowly until either the dielectric core material (barium titante) broke down (as evidenced by an increased flow of current or breakage of the core), or electricity arced between the gound and pin electrodes across the band of sealant material.

Similar DWV testing was conducted on filter sleeve having uncoated chamfered edges. The tests showed that banded filter sleeves will withstand higher voltages than chamfered sleeves before arcing occurred. At 50 percent relative humidity the electricity will arc at about 750 volts for the banded sleeves while electricity will arc at about 400-450 volts for the chamfered sleeves.

It is thought that the sealed filter sleeve of the present invention and many of its attendant advantages will be understood from the foregoing description. It will be apparent that various changes may be made in the form, construction and arrangement of the parts thereof without departing from the spirit or scope of the invention or sacrificing all its material advantages.

The foregoing examples illustrate the invention. They are not to be construed as limitations on the invention except as indicated in the appended claims.

What is claimed is:

1. A sealed filter member comprising:
   a body means having selected first and second surface portions, said selected first portions defining discontinuities between and surrounding said second surface portions;
   a dielectric polymerizable material polymerized on and adhered to said selected first surface portions of said body means defining sealed surface portions; and
   plating material disposed on said second surface portions of said body means defining plated surface portions;
   whereby said plated surface portions comprise electrically disconnected electrode means and said polymerized dielectric material both excludes said plating material from said first surface portions during plating and permanently seals said body means at said sealed surface portions defining a plated filter member having said plated surface portions and sealed surface portions.

2. The sealed filter member as described in claim 1 wherein said polymerized dielectric material further is resistant to solder and solvents and excludes solder and solvents from said sealed surface portions.

3. The sealed filter member as described in claim 1 wherein polymerization of said polymerizable dielectric material is activated by electromagnetic radiation.

4. The sealed filter member as described in claim 3 wherein said electromagnetic radiation for polymerizing said dielectric material is selected from the group consisting of ultraviolet light, visible light, heat and combinations thereof.

5. The sealed filter member as described in claim 1 wherein said polymerizable composition is comprised of a major proportion of at least one vinyl ester resin, a minor proportion of at least one polymerizable acrylic diluent monomer, and a polymerization activation system selected to be activated by a selected electromagnetic radiation.

6. The sealed filter member as described in claim 1 wherein said filter member is a filter sleeve member.

7. The sealed filter member as described in claim 6 mounted on and electrically connected to electrical contact means.

8. A filter member of the type comprising a body means having plating material disposed on substantially all surfaces thereof wherein the plating material comprises a plurality of discontinuous sections said filter member being characterized in that:

the surface of an unplated filter body means comprises the selected first and second portions, said selected first surface portions defining discontinuities between and surrounding said second surface portions;

a dielectric polymerizable material is polymerized on said selected first surface portions of said unplated body means and adherent thereto defining sealed surface portions;

said plating material is disposed on said second surface portions defining plated surface portions;

whereby said plated surface portions comprise electrically disconnected electrode means and said polymerized dielectric material both excludes said plating material from said sealed surface portions during plating and permanently seals said body means at said sealed surface portions, defining a plated filter member having said plated surface portions and sealed surface portions.

9. The filter member as described in claim 8 wherein said polymerized dielectric material further is resistant to solder and solvents and excludes solder and solvents from said sealed surface portions.

10. The filter member as described in claim 8 wherein polymerization of said polymerizable dielectric material is activated by electromagnetic radiation.

11. The filter member as described in claim 10 wherein said electromagnetic radiation for polymerizing said dielectric material is selected from the group consisting of ultraviolet light, visible light, heat and combinations thereof.

12. The filter member as described in claim 8 wherein said polymerizable composition is comprised of a major proportion of at least one vinyl ester resin, a minor proportion of at least one polymerizable acrylic diluent monomer, and a polymerization activation system selected to be activated by a selected electromagnetic radiation.

13. A process for making a sealed filter member comprising the steps of:

selecting a filter member;

disposing a dielectric polymerizable material onto selected first surface portions of said body member, said selected first surface portions defining discontinuities between and surrounding second surface portions;

polymerizing said dielectric polymerizable material on said selected first surface portions of said body means defining sealed surface portions; and disposing plating material on said second surface portions of said body means defining plated surface portions;

whereby said plated portions comprise electrically disconnected electrode means and said polymerized dielectric material both excludes said plating material from said sealed surface portions during plating and permanently seals said body means at said sealed surface portions defining a plated filter member having said plated surface portions and sealed surface portions.

14. The process as described in claim 12 wherein said polymerization of said dielectric polymerizable material is activated by electromagnetic radiation.

15. The process as described in claim 13 wherein said electromagnetic radiation for polymerizing said dielectric material is selected from the group consisting of ultraviolet light, visible light, heat and combinations thereof.

* * * * *